United States Patent
Ho et al.

(10) Patent No.: US 6,317,620 B1
(45) Date of Patent: Nov. 13, 2001

(54) METHOD AND APPARATUS FOR RAPID ASSESSMENT OF STENOSIS SEVERITY

(75) Inventors: Vincent B. Ho, North Bethesda; Thomas K. F. Foo, Rockville, both of MD (US)

(73) Assignees: General Electric Company, Milwaukee, WI (US); Uniformed Services University of Health Sciences, Bethesda, MD (US)

( * ) Notice: Subject to any disclaimer, the term of this patent is extended or adjusted under 35 U.S.C. 154(b) by 0 days.

(21) Appl. No.: 09/565,978

(22) Filed: May 4, 2000

(51) Int. Cl.[7] .................................................. A61B 5/055
(52) U.S. Cl. ...................... 600/419; 600/420; 324/306; 324/309
(58) Field of Search .................................. 600/419, 410, 600/413, 420; 324/306, 307, 309

(56) References Cited

U.S. PATENT DOCUMENTS

| | | | |
|---|---|---|---|
| 4,752,734 | * | 6/1988 | Wedeen ............................. 324/306 |
| 5,853,365 | * | 12/1998 | Yamagata ........................... 600/410 |
| 6,236,738 | * | 5/2001 | Zhu et al. .......................... 382/107 |

* cited by examiner

Primary Examiner—Ruth S. Smith
(74) Attorney, Agent, or Firm—Timothy J. Ziolkowski; Cook & Franke SC; Michael A. Della Penna

(57) ABSTRACT

A method and apparatus is disclosed to rapidly assess the severity of a stenosis using MR technology. The invention includes identifying a suspected stenotic vessel and applying a phase contrast pulse sequence to the stenotic vessel in which the MR operator is allowed to control the amplitude and direction of the flow encoding gradient. Peak flow velocity is determined in the suspected stenotic vessel by correlating the flow encoding gradient with the onset of flow velocity aliasing. In a preferred embodiment, the invention utilizes a 2D fast gradient echo pulse sequence having flow sensitizing bipolar gradient waveforms. The resulting flow sensitizing gradients are substantially coincident in time, thereby allowing rotation of the resultant flow sensitizing gradient direction. The amplitude of the flow encoding gradient is increased until the observance of flow related aliasing. Once flow related aliasing is observed, the velocity encoding (VENC) value is recorded and used as the indicator of peak flow velocity in the suspected stenotic vessel. The process can be repeated along the suspected stenosis vessel to isolate and assess the severity of the stenosis by comparing the peak flow velocity VENC values obtained at various locations along the suspected stenosis.

21 Claims, 3 Drawing Sheets

METHOD AND APPARATUS FOR RAPID ASSESSMENT OF STENOSIS SEVERITY

BACKGROUND OF THE INVENTION

The present invention relates generally to the art of assessing the severity of stenosis in a human subject, and more particularly, to an apparatus and method that rapidly assesses the severity of a stenosis using magnetic resonance imaging (MRI) technology.

The narrowing or constriction of vessels carrying blood to the heart is a well-known cause of heart attacks, and gone untreated, can lead to sudden death. In such stenotic vessels, it is known that the region immediately downstream from the constriction is characterized by having rapid flow velocities and/or complex flow patterns. In general, narrowing of blood carrying vessels supplying an organ will ultimately lead to compromised function of the organ in question, at best, and organ failure at worst. Quantitative flow data can readily aid in the diagnosis and management of patients and also help in the basic understanding of disease processes. There are many techniques available for the measurement of blood flow, including imaging based methods using radiographic imaging of contrast agents, both in projection and computed tomography (CT), ultrasound, and nuclear medicine techniques. Radiographic and nuclear medicine techniques require the use of ionizing radiation and/or contrast agents. Some methods involve making assumptions about the flow characteristics which may not necessarily be true in vivo or require knowledge about the cross-sectional area of the vessel or the flow direction.

The functional significance of a stenosis is conventionally determined using Doppler ultrasound to measure the velocity/pressure gradient across the vessel constriction along the axis of flow. The higher the gradient, the more significant the stenosis. However, using Doppler ultrasound is dependent on having an acoustic window allowing the ultrasound beam to insonify the vessel of interest at an angle of incidence as close to zero (i.e., parallel to the vessel) as possible. Furthermore, Doppler ultrasound does not provide the quality of images that are produced using MR technology. Further, ultrasound techniques are difficult to apply in certain situations because of intervening tissues such as bone, excessive fat or air.

Phase contrast magnetic resonance angiography (MRA) is a practical and clinically applicable technique for imaging blood flow. MRI utilizes radio frequency pulses and magnetic field gradients applied to a subject in a strong magnetic field to produce viewable images. When a substance containing nuclei with net nuclear magnetic moment, such as the protons in human tissue, is subjected to a uniform magnetic field (polarizing field $B_0$), the individual magnetic moments of the spins in the tissue attempt to align with this polarizing field (assumed to be in the z-direction), but precess about the direction of this magnetic field at a characteristic frequency known as the Larmor frequency. If the substance, or tissue, is subjected to a time-varying magnetic field (excitation field $B_1$) applied at a frequency equal to the Larmor frequency, the net aligned moment, or "longitudinal magnetization", $M_z$, may be nutated, or "tipped", into the x-y plane to produce a net transverse magnetic moment $M_t$. A signal is emitted by the excited spins after the excitation signal $B_1$ is terminated (as the excited spins decays to the ground state) and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting MR signals are digitized and processed to reconstruct the image using one of many well-known reconstruction techniques.

MRA makes use of flow encoding gradient pulses which impart a velocity-dependent phase shift to the transverse magnetization of moving spins while leaving stationary spins unaffected (Moran P. R. A Flow Velocity Zeugmatographic Interlace for NMR Imaging in Humans. Magnetic Resonance Imaging 1982; 1: 197–203). Each phase contrast acquisition generates two images: a magnitude image that is proportional to the proton density of the object and may also be $T_1$-weighted, and an image representing the phase of the object. The phase image produced has information only from the moving spins and the signal from stationary tissue is suppressed. Images representing both the average flow over the entire cardiac cycle and at a series of individual points in the cycle have been generated using this technique. The phase contrast MR method produces phase images with intensities that represent the magnitude of the flow velocity and also the direction of flow. Therefore, such images may be used for both qualitative observation of blood flow and quantitative measurement. The practical application of phase contrast MR angiography and venography to the quantitative determination of flow velocity is therefore evident.

It would therefore be desirable to have a method and apparatus for rapid assessment of stenosis severity using MR technology.

SUMMARY OF THE INVENTION

The present invention relates to a system and method to rapidly assess the severity of stenosis using MRI, that solves the aforementioned problems.

The present invention utilizes the fact that hemodynamically significant stenoses can be characterized by high pressure or velocity gradients across the flow axis, along the length of the stenosis. The invention uses a real-time imaging pulse sequence that allows the user to control the value of the velocity encoding gradient (VENC) and the direction of the velocity encoding gradient value. The peak velocity across the stenosis can then be determined rapidly by correlating the onset of flow velocity aliasing and the VENC setting. In a preferred embodiment, the pulse sequence used has flow sensitizing bipolar gradient waveforms in a 2D fast gradient echo pulse sequence. Because the preferred embodiment uses flow sensitizing gradients that are coincident in time, the resultant flow sensitizing direction can also be rotated in real-time by the user. The amplitude of the flow encoding gradient is increased until the onset of flow related aliasing is observed, at which point, the VENC value corresponds to the peak flow velocity across the stenosis, which in turn is used as an indicator for the severity of the stenosis.

Therefore, in accordance with one aspect of the invention, a method of determining peak flow velocity across a stenosis includes identifying a stenotic vessel and applying a real-time phase contrast imaging pulse sequence to the stenotic vessel to allow user control of a VENC value. The method includes determining peak flow velocity in the stenotic vessel by correlating the VENC value with an onset of flow velocity aliasing. Preferably, the pulse sequence has flow sensitizing gradients that are coincident in time to allow a user to rotate flow sensitizing gradients in real-time, and more preferably, is a 2D fast gradient echo pulse sequence having bipolar gradient waveforms for flow sensitizing. In determining peak flow velocity, the amplitude of the flow encoding gradient is increased until the flow related aliasing is detected.

In accordance with another aspect of the invention, a method for rapid assessment of stenosis severity is disclosed that includes identifying a first location of a suspected stenosis and applying a phase contrast MR imaging pulse sequence to the first location of the suspected stenosis. The pulse sequence applied has a real-time user controlled VENC value. The method next includes increasing the VENC value and reapplying the pulse sequence until the user observes flow-related aliasing, and then recording the VENC value as an indication of the peak flow velocity across the first location of the suspected stenosis. The method next includes resetting the VENC value, applying the pulse sequence to a second location of the suspected stenosis, and then increasing the VENC value, and reapplying the pulse sequence until the user observes flow-related aliasing. The VENC value is then recorded as an indication of peak flow velocity across the second location of the suspected stenosis. Preferably, the method includes comparing the VENC value of the first location with that of the second location to determine severity of the suspected stenosis.

In accordance with another aspect of the invention, MRI apparatus is disclosed to rapidly assess stenosis severity that includes an MRI system having a number of gradient coils positioned about a bore of a magnet to impress a polarizing magnetic field, an RF transceiver system, and an RF modulator controlled by a pulse control module to transmit RF signals to an RF coil assembly in order to acquire MR images. The MRI apparatus includes a computer programmed to activate the MRI system and apply a real-time phase contrast pulse sequence to a stenotic vessel, wherein the pulse sequence has flow sensitizing gradients, and allow user input to adjust a value of a velocity encoding gradient (VENC). The computer is then programmed to apply the adjusted VENC value and determine whether flow related aliasing is evident, which may be accomplished with either a user input or through an automatic comparison algorithm. The computer is programmed to repeat the acts of allowing the user to adjust the VENC value, applying the adjusted VENC value, and determining whether the flow related aliasing is evident, until the VENC value provides determinable flow related aliasing that thus corresponds to a peak flow velocity across the stenosis.

In accordance with yet another aspect of the invention, the aforementioned method is implemented in a computer program that is fixed on a computer readable storage medium that, when executed, causes a computer to apply a phase contrast MR imaging pulse sequence to a first location of a suspected stenosis in which the pulse sequence has a VENC value controllable by a user, and then modify the VENC value based on the user selection and reapply the pulse sequence until detection of flow-related aliasing occurs. The computer program then records the VENC value as an indication of the peak flow velocity across the first location of the suspected stenosis and then applies another phase contrast MR imaging pulse sequence to a second location to the suspected stenosis. The VENC value is again modified based on the user's selection and the pulse sequence is reapplied until detection of flow-related aliasing occurs. The VENC value is recorded as an indication of the peak flow velocity across the second location of the suspected stenosis, and then the VENC values can be compared to determine severity of the suspected stenosis.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
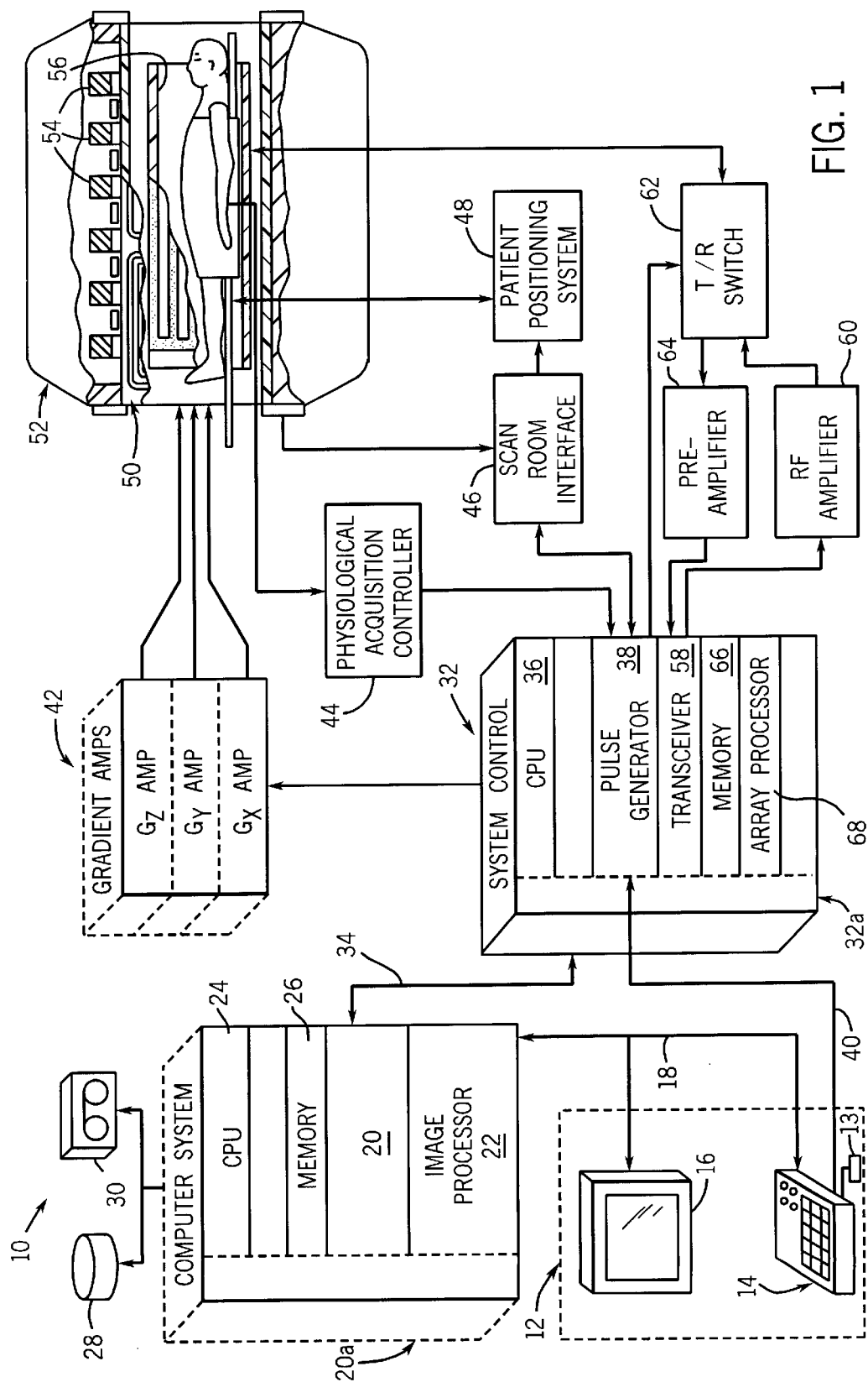
FIG. 1 is a schematic block diagram of an MR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28, a tape drive 30, or any other form of computer readable storage medium for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. The pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced MR system, or any similar or equivalent system for obtaining MR images, that is used to determine peak flow velocity across a stenosis and rapidly assess the severity of the stenosis.

Figure 2:
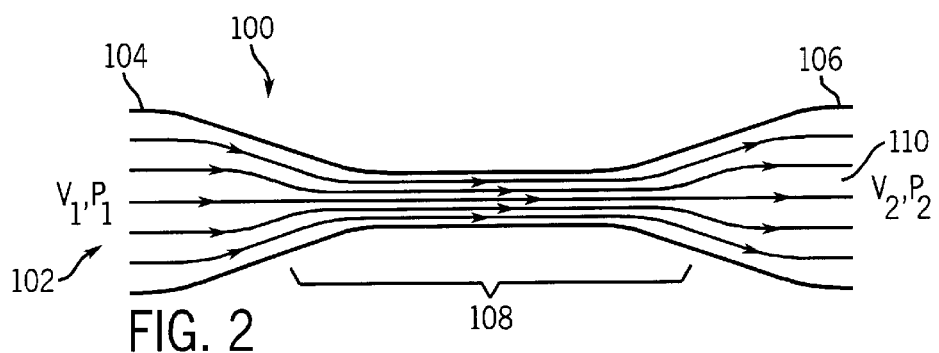
FIG. 2 is a schematic representation of an exemplary stenotic vessel in a human patient for which the present invention is directed to assessing the severity of such stenosis.

Referring to FIG. 2, a schematic representation of a blood vessel 100 is shown longitudinally with viscous blood 102 flowing therethrough. The blood vessel 100 is shown with a first end 104 acting as an inlet, and a second end 106 acting as an outlet. Between ends 104 and 106 is a constriction, or a stenotic area 108. The present invention capitalizes on the fact that the blood flow velocity $V_2$ at the outlet end 106 is greater than the blood flow velocity $V_1$ at the inlet at 104 (i.e., $V_2>V_1$), and, correspondingly, the blood pressure $P_2$ at the outlet end 106 is less than the blood pressure $P_1$ at the inlet end 104 (i.e., $P_2<P_1$). In general, in a stenotic vessel, such as blood vessel 100, the region 110 within the outlet end of the vessel 106, which is immediately downstream from the constriction 108, is characterized by having rapid blood flow velocities, or complex blood flow patterns. Furthermore, in regions where the degree of constriction is high, the emerging flow patterns in region 110 cease to be laminar and take on complex flow patterns, including the generation of flow vortices or eddys.

The present invention takes advantage of the fact that hemodynamically significant stenoses can be characterized by the high velocity gradients across the flow axis, and along its length. The hemodynamic severity of the stenosis can then be graded by the changes in the velocity gradients through the stenotic area. To do so, the present invention utilizes a real-time phase contrast MR image pulse sequence with phase difference processing to evaluate the peak flow velocity across such a stenosis. Thus, the user is allowed to control a direction of a velocity encoding gradient and a value of the velocity encoding gradient, hereinafter referred to as the VENC value. In general, by increasing the VENC value until an onset of flow related aliasing is observed, the peak velocity across the stenosis can be determined by correlating the onset of flow velocity aliasing with the VENC setting. In some cases, it may be preferred to additionally administer a contrast agent to shorten the $T_1$ time to improve the signal intensity, and consequently, increase the signal-to-noise ratio. This will result in a corresponding increase in the effectiveness of assessing the severity of the stenosis according to the present invention.

Figure 3:
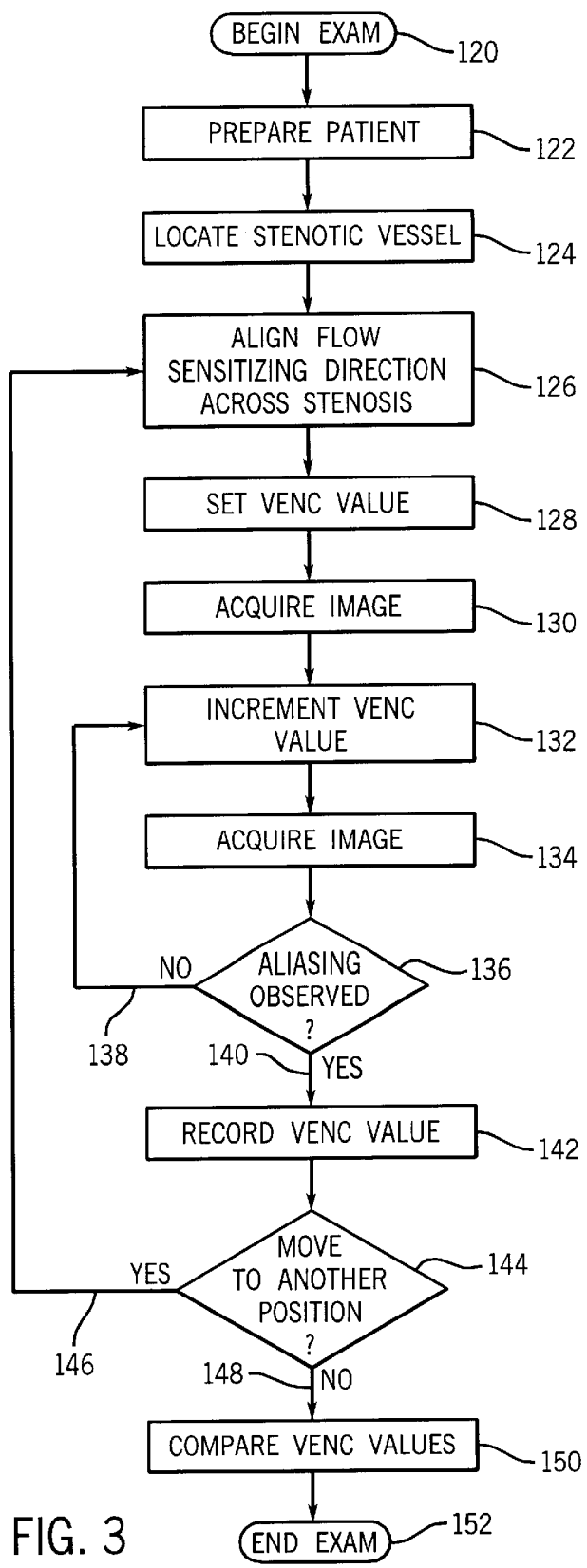
FIG. 3 is a flow chart illustrating an embodiment of the present invention.

In accordance with the invention, FIG. 3 is a flow chart showing the method and a representation of the software programmed into the computer of the MRI apparatus of FIG. 1. Upon initiation 120, a patient is prepared 122 to undergo an MRI exam, as is well known. The patient and/or the MR apparatus are situated so as to acquire MR images in an area of a suspected stenotic vessel 124. Using the real-time phase contrast pulse sequence, as previously mentioned and will be further described with reference to FIG. 4, the flow sensitizing direction is aligned along the direction or axis of flow and across the stenosis at 126. At this point, the VENC value 128 is set to a value below which it is known that flow velocity aliasing will not occur, or an image can be acquired to set the VENC value where no aliasing is observed. FIG. 5 shows an example of such flow related aliasing. FIG. 5 is a cross-section of a vessel 100, such as that shown in FIG. 2. Without any flow related aliasing, the vessel 100 will appear as a white-out in the reconstructed MR image as depicted by reference number 182. The phase within the vessel is also smoothly varying. However, after the onset of flow related aliasing (which will be described mathematically in more detail hereinafter), aliasing section 184 appears darkened, either in shades of gray or in black. Aliasing section 184 may appear as an entire portion of the vessel 100, as shown in FIG. 5, or may appear as a strip or smaller section of the vessel 100. In addition, the onset of flow related aliasing can be characterized by the abrupt changes in the phase within the vessel. In any case, when the VENC value is increased to the aliasing point, there will be some indication of sudden graying within the vessel.

Referring back to FIG. 3, once the VENC value is set 128, an image is acquired 130, the VENC value is increased 132, and another image is acquired 134. That image is then used to determine whether flow related aliasing has occurred in the stenotic vessel 136. If it has not 138, the VENC value is incrementally increased 132 until flow related aliasing is observed 136, 140 in the image acquired at 134. The VENC value 132 which resulted in the onset of flow related aliasing 136, 140 is then recorded at 142. If it is desired to acquire another set of data in a different position along the stenotic vessel 144, the acquisition site is relocated along the stenotic vessel 146, and the aforementioned process is repeated as many times as desired by the MR operator. That is, the spins are again aligned along the flow sensitizing direction across the stenosis 126, the VENC value is reset at 128, an image is acquired at 130, and then the VENC value is incremented 132 until aliasing is observed 136, 140 in the acquired image 134. After the VENC value is again recorded 142, and the MR operator has acquired sufficient data 144, 148, the correlated VENC values can then be compared 150 in order to determine the severity of the stenosis and/or the exact location of the stenosis. The exam is then complete 152.

Figure 4:
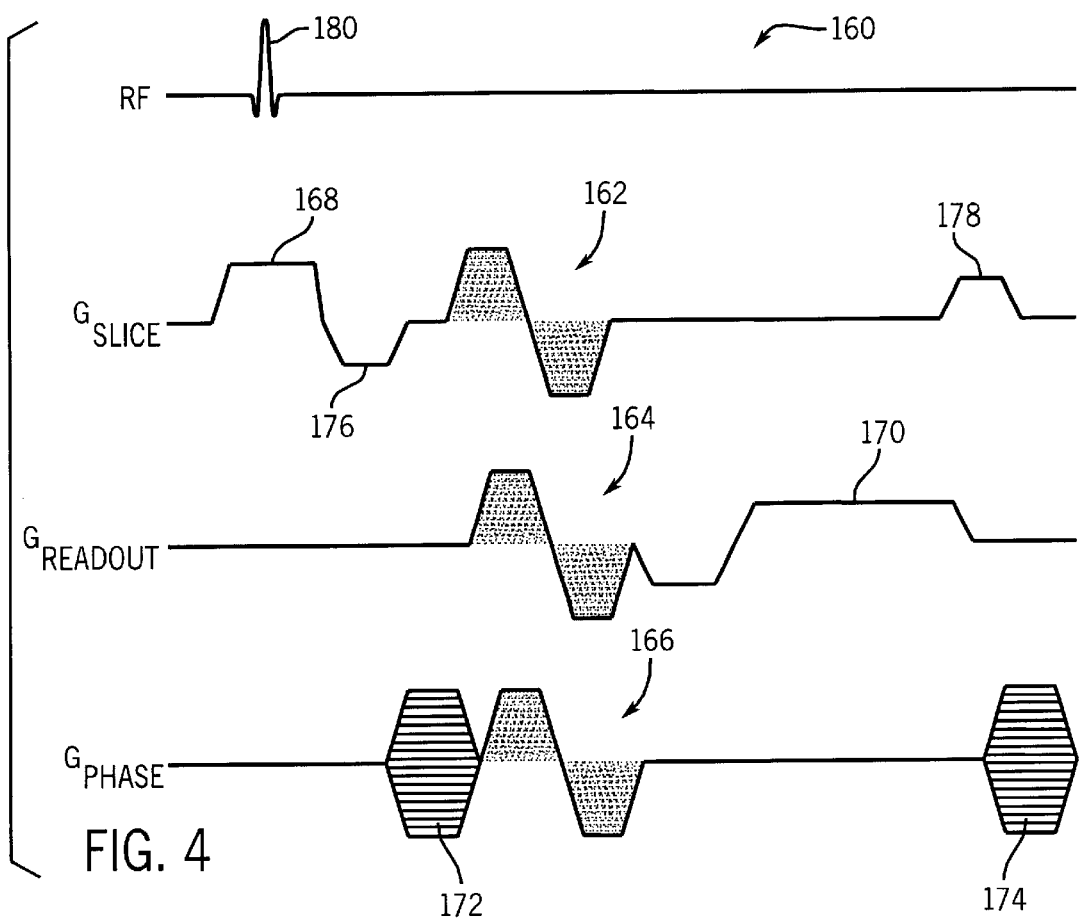
FIG. 4 is a timing diagram of an MR imaging pulse sequence used in the invention.
Figure 5:
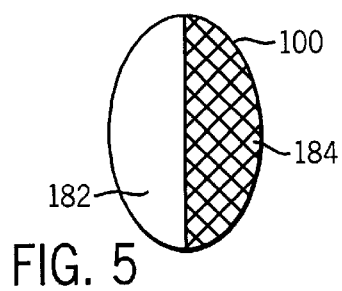
FIG. 5 is a schematic representation of a cross-section of a blood vessel showing flow velocity aliasing.

FIG. 4 shows the phase contrast imaging pulse sequence 160 used in the present invention. As shown in this preferred embodiment, the flow sensitizing gradients 162, 164, and 166 are relatively coincident in time to allow the direction of the flow sensitizing gradients to be rotated in real-time by the user. It is understood that although FIG. 4 shows the flow sensitizing gradients substantially aligned, the importance of the placement of the flow sensitizing gradients is that they be relatively coincident with respect to the overall pulse sequence 160. It is preferred that the flow sensitizing gradients 162, 164, and 166 be located relatively coincident in time between the pulse encoding gradient 168 and the readout gradient 170. The phase encoding gradients 172 and 174, along with the gradient crushers 176, 178 and the RF pulse 180 are each shown as reference points.

Next, a brief summary description of the VENC value calculation is provided. The value of the first moment for a single bi-polar gradient waveform is given by:

$$M_1 = AT,\qquad [1]$$

where A is the area of the uni-polar part of a bi-polar gradient waveform, and T is the temporal separation between the two uni-polar lobes, each having opposite polarity, that constitute the bi-polar gradient waveform, as shown in FIG. 4. The resulting phase generated by the bi-polar gradient waveform is given by:

$$\phi = \gamma M_1 \vec{v},\qquad [2]$$

where γ is the gyromagnetic ratio and $\vec{v}$ is the velocity. The phase that is measured in phase-difference processing is given by:

$$\Delta\phi = 2\gamma M_1 \vec{v}.\qquad [3]$$

Since the VENC value is such that at that particular velocity, the corresponding phase shift is π radians, the first moment of the bi-polar waveform is adjusted such that:

$$M_1 = \frac{\pi}{2\gamma VENC}.\qquad [4]$$

For velocities exceeding this VENC value, the phase difference is greater than |π|, and therefore aliasing occurs. As previously mentioned, the VENC value is then used as an indication of the peak flow velocity. The degree of stenosis severity is determined to be greater as the VENC value increases.

The following description is a more complete explanation of phase contrast imaging. Considering a magnetic field gradient applied in a specific direction, the phase accumulated by a spin ensemble is a function of the equation of motion of that ensemble and the applied gradient field. That is:

$$\phi = \int_0^t \gamma \vec{G}(t)\cdot\vec{r}(t)dt,\qquad [5]$$

where $\vec{G}(t)$ is the vector describing the time-varying gradient (direction and amplitude), and $\vec{r}(t)$ is the motion vector such that $$\vec{r}(t) = \vec{r}_0 + \vec{v}t + \tfrac{1}{2}\vec{a}t^2 + \ldots,\qquad [6]$$

with the first term representing the initial position of the spin ensemble at time t=0 and the other terms representing the motion due to a constant velocity, acceleration, and the higher orders of motion. The higher orders of motion can be ignored for this description since the constant velocity component predominates.

To have a better understanding of the interaction of velocity and phase, Eqn. [5] can be expanded as:

$$\phi = \gamma r_0 \int_0^t G(t)dt + \gamma v \int_0^t t\,G(t)dt = \gamma r_0 M_0 + \gamma v\,M_1,\qquad [7]$$

where $M_0$ and $M_1$ represent the zeroth and first gradient moments, respectively. If G(t) is a single, uni-polar gradient lobe, the phase in a volume element would be given by Eqn.[7]. If, immediately following this gradient, an identical uni-polar gradient is applied with opposite sign, the phase due to this second gradient lobe is given by:

$$\phi' = \gamma r_0 M'_0 + \gamma v M'_1.\qquad [8]$$

Since the zeroth moment is merely the area under the gradient lobe, $M'_0$ is equal to $-M_0$. When combined, the two uni-polar lobes of identical area, but of opposite sign, are essentially a single bipolar gradient waveform. However, as the first moment is an integral weighted by time, $M'_1$, does not equal $-M_1$. The phase accumulated by the combined bipolar gradient lobe is then the sum of Eqn.[7] and Eqn.[8], which is given by:

$$\phi_1 = \phi + \phi' = \gamma v(M'_1 + M_1).\qquad [9]$$

Note that the phase accumulation from an applied bipolar gradient is independent of initial position and is directly proportional to the velocity. The bipolar gradient has a zero net area and has no effect on stationary tissue. Thus, without any loss of generality, G(t) can be considered a single bipolar waveform, such that the phase is simply given by Eqn. [2]:

In a perfect experiment, a single acquisition with a bipolar gradient will provide an image whose phase represents flow in the direction of the applied gradient as given by Eqn.[2]. However, residual eddy currents, magnetic field homogeneity, and magnetic susceptibility contribute to a spatially varying non-zero phase, even for stationary tissue. This spatial phase variation is not flow-related and can be large across an image. In order to avoid this problem, two images with bipolar gradients of opposite sign (toggled bipolar gradients) are subtracted. Any non-zero phase due to stationary tissue are canceled out, leaving an image with the difference in phase accumulated in the two acquisitions. By inverting the bipolar waveform for the second acquisition, the phase of this subsequent acquisition is the negation of Eqn.[2], (i.e., $\phi_2 = -\phi_1$), and $M_{1,acq2} = -M_{1,acq1} = -M_1$. The phase difference in the subtracted image is then:

$$\Delta\phi = \phi_1 - \phi_2 = \gamma \vec{v}\,\Delta M_1,\qquad [10]$$

with $$\Delta M_1 = \int_0^t 2tG(t)dt.\qquad [11]$$

From the phase difference equation, Eqn.[10], it is clear that if the spins reverse flow direction, i.e., $\vec{v}$ reverses sign, there is a corresponding change in the sign of Δφ. Thus, the magnitude of a phase difference image provides a measure of the flow velocity, while the sign indicates flow direction.

The phase difference image (after subtraction) displays the value of Eqn.[10] at each pixel. The phase shift given by Eqn.[10] is proportional to velocity and the difference in the first gradient moment (Eqn.[11]). If Δφ exceeds π radians or 180°, or the misrepresentation of one phase as that of another different phase, aliasing occurs, as shown in FIG. 5. For example, a phase difference of +190° is indistinguishable from a phase difference of −170° or even −530°. Thus, spins with a high velocity may be represented as having a lower velocity or spins flowing in one direction may be incorrectly represented as flowing in the opposite direction. This is the phenomenon herein referred to as velocity flow aliasing and is analogous to image warp-around.

In order to find the point of flow related aliasing, the phase shifts in Eqn.[10] are first brought to within ±180° (±π radians). Then by dialing up the VENC value until the onset of flow related aliasing, the peak velocity can be determined as previously mentioned.

Accordingly, the present invention includes a method for determining peak flow velocity across the stenosis that includes locating a vessel for stenosis severity assessment, applying a real-time phase contrast imaging pulse sequence to the vessel to allow user control of a flow encoding gradient, and determining peak flow velocity in the stenotic vessel by correlating the flow encoding gradient to an onset of flow velocity aliasing. As described, preferably the pulse sequence has flow sensitizing gradients that are relatively coincident in time to allow a user to rotate the flow sensitizing gradients in real-time.

The invention also includes a method for rapid assessment of stenosis severity that includes identifying a first location of a suspected stenosis in a vessel and applying a phase contrast MR imaging pulse sequence to the first location of the suspected stenosis. As previously described, since the pulse sequence has a real-time user controlled VENC value, the method includes increasing the user controlled VENC value and reapplying the pulse sequence until a user observes flow related aliasing. That particular VENC value is then noted as an indication of peak flow velocity across the first location of the suspected stenosis. The VENC value is then reset and the pulse sequence is applied to a second location of the suspected stenosis. Again, the method includes increasing the user controlled VENC value and reapplying the pulse sequence until the user observes flow related aliasing, and then recording that VENC value as an indication of peak flow velocity across the second location of the suspected stenosis. The method next includes comparing the VENC values acquired at the first location with that acquired at the second location to determine severity of the suspected stenosis. Preferably, the pulse sequence is a two-dimensional fast gradient echo pulse sequence having flow sensitizing bipolar gradient waveforms that are relatively coincident in time. Additionally, the method can include allowing user rotation of resultant flow sensitizing gradients in real-time. As previously mentioned, administering a contrast agent can be desirable to improve signal intensity and resulting resolution.

The aforementioned methods are incorporated into an MRI apparatus that can rapidly assess stenosis severity which includes an MRI system having a plurality of gradient coils positioned about the bore of a magnet to impress a polarizing magnetic field, an RF transceiver system, and an RF switch controlled by a pulse module to transmit RF signals to an RF coil assembly to in turn acquire MR images. A computer is programmed to apply a real-time phase contrast pulse sequence to a suspected stenotic vessel, where the pulse sequence has flow sensitizing gradients that are relatively coincident in time, and allow a user to adjust a VENC value of a velocity encoding gradient. The computer is also programmed to apply the pulse sequence of the adjusted VENC value and determine whether flow related aliasing is evident. The program then repeats the acts of allowing a user to adjust the VENC value, applying a pulse sequence with that VENC value, and determining whether flow related aliasing has occurred, until the VENC value selected provides determinable flow related aliasing that thus corresponds to a peak flow velocity across the suspected stenosis. In the preferred embodiment, the MR operator observes or detects the onset of flow related aliasing, however, it is contemplated, and within the scope of this invention, that a suitable algorithm could be implemented within the invention such that the computer can make the aliasing determination.

The invention also includes a computer readable storage medium having stored thereon a computer program having instructions which, when executed by a computer, cause the computer to apply a phase contrast MR imaging pulse sequence to a first location of a suspected stenosis, wherein the pulse sequence has a user controllable VENC value, and then to modify or accept modification of the VENC value based on a user input and reapply the pulse sequence until detection of flow related aliasing occurs. The VENC value is then recorded as an indication of peak flow velocity across the first location of the suspected stenosis. Another phase contrast MR imaging pulse sequence is applied to a second location of the suspected stenosis, and again the VENC value is modified based on a user input and reapplied until detection of flow related aliasing. The VENC value that results in flow related aliasing is recorded by the computer as an indication of the peak flow velocity across the second location of the suspected stenosis. The computer can then compare the VENC value of the first location with that of the second location to determine severity of the suspected stenosis.

It should now be readily apparent to those skilled in the art that this real-time method for velocity measurement will also expedite and improve the determination of the appropriate or ideal VENC value for a subsequent 2D or 3D diagnostic phase contrast MRA acquisition. Proper VENC prescription minimizes image artifacts related to signal aliasing and optimizes vessel signal on phase contrast MRA images. This will also reduce the likelihood for repeat phase contrast MRA secondary to poor VENC prescription (too high or too low a VENC value).

The present invention has been described in terms of the preferred embodiment, and it is recognized that equivalents, alternatives, and modifications, aside from those expressly stated, are possible and within the scope of the appending claims.

What is claimed is:

1. A method for determining peak flow velocity across a stenosis comprising the steps of:
   locating a vessel for stenosis severity assessment;
   applying a real-time phase contrast imaging pulse sequence to the vessel to allow user control of a flow encoding gradient value; and
   determining peak flow velocity in the stenotic vessel by correlating the flow encoding gradient value to an onset of flow velocity aliasing.

2. The method of claim 1 wherein the pulse sequence has flow sensitizing gradients that are relatively coincident in time to allow a user to rotate flow sensitizing gradients in real-time.

3. The method of claim 1 further comprising the step of increasing an amplitude of the flow encoding gradient value until flow-related aliasing is detected.

4. The method of claim 3 wherein a user increases the amplitude until the flow-related aliasing is observed by the user.

5. The method of claim 3 wherein the amplitude is increased until the flow encoding gradient value corresponds to the peak flow velocity.

6. The method of claim 1 further including providing user adjustability of the velocity encoding gradient value and a direction of the flow encoding gradient.

7. The method of claim 1 further comprising the step of administering a contrast agent before applying the pulse sequence to increase a signal-to-noise ratio.

8. The method of claim 1 wherein the step of determining peak flow velocity is accomplished in real-time and further includes expediting and improving a determination of an appropriate VENC value for a subsequent 2D or 3D diagnostic phase contrast MRA acquisition to minimize image artifacts related to signal aliasing and optimizing vessel signal on phase contrast MRA images.

9. The method of claim 8 wherein the step of determining peak flow velocity allows reducing a likelihood for repeat phase contrast MRA secondary to an inaccurate VENC value prescription.

10. A method for rapid assessment of stenosis severity comprising the steps of:
    identifying a first location of a suspected stenosis;
    applying a phase contrast MR imaging pulse sequence to the first location of the suspected stenosis, the pulse sequence having a real-time user-controlled VENC value;
    increasing the real-time user-controlled VENC value and reapplying the pulse sequence until a user observes flow-related aliasing;
    recording the real-time user-controlled VENC value as an indication of peak flow velocity across the first location of the suspected stenosis;
    resetting the real-time user-controlled VENC value;
    applying the pulse sequence to a second location of the suspected stenosis;
    increasing the real-time user-controlled VENC value and reapplying the pulse sequence until the user observes flow-related aliasing;
    recording the real-time user-controlled VENC value as an indication of peak flow velocity across the second location of the suspected stenosis; and
    comparing the real-time user-controlled VENC value of the first location with that of the second location to determine severity of the suspected stenosis.

11. The method of claim 10 wherein the MR pulse sequence is a 2D fast gradient echo pulse sequence having flow sensitizing bi-polar gradient waveforms that are relatively coincident in time.

12. The method of claim 11 further comprising the step of allowing user rotation of resultant gradients in real-time.

13. The method of claim 10 the step of increasing the real-time user-controlled VENC value is further defined as increasing an amplitude of a velocity encoding gradient until the VENC value corresponding to a peak flow velocity to thereby identify severity of the suspected stenosis.

14. The method of claim 10 comprising the step of administering a contrast agent in a subject to improve signal intensity, thereby allowing increased resolution of user observation of flow-related aliasing.

15. An MRI apparatus to rapidly access stenosis severity comprising:
    a magnetic resonance imaging (MRI) system having a plurality of gradient coils positioned about the bore of a magnet to impress a polarizing magnetic field and an RF transceiver system and an RF switch controlled by a pulse module to transmit RF signals to an RF coil assembly to acquire MR images; and
    a computer programmed to:
    (A) apply a real-time phase contrast pulse sequence to a suspected stenotic vessel, where the pulse sequence has flow sensitizing gradients that are relatively coincident in time;
    (B) allow a user to adjust a VENC value of a velocity encoding gradient;
    (C) apply the pulse sequence with the VENC value as adjusted by the user;
    (D) determine whether flow-related aliasing is evident; and
    (E) repeat acts (B) through (D) until the VENC value provides determinable flow-related aliasing that thus corresponds to a peak flow velocity across the suspected stenosis.

16. The apparatus of claim 15 wherein the computer is further programmed to allow rotation of the flow sensitizing gradients in real-time.

17. The apparatus of claim 15 wherein the computer is further programmed to increase an amplitude of the VENC value until flow-related aliasing is observable.

18. A computer readable storage medium having stored thereon a computer program comprising instructions which, when executed by a computer, cause the computer to:
    apply a phase contrast MR imaging pulse sequence to a first location of a suspected stenosis, the pulse sequence having a VENC value controllable by a user;
    modify the VENC value based on a user input and reapply the pulse sequence until detection of flow-related aliasing;
    record the VENC value as an indication of peak flow velocity across the first location of the suspected stenosis;
    apply another phase contrast MR imaging pulse sequence to a second location of the suspected stenosis, the pulse sequence having a VENC value controllable by the user;
    modify the VENC value based on a user input and reapply the pulse sequence until detection of flow-related aliasing;
    record the VENC value as an indication of peak flow velocity across the second location of the suspected stenosis; and
    compare the VENC value of the first location with that of the second location to determine severity of the suspected stenosis.

19. The computer readable storage medium of claim 18 wherein the computer program further causes the computer to create and apply the MR pulse sequence as a 2D fast gradient echo pulse sequence having flow sensitizing bi-polar gradient waveforms that are relatively coincident in time.

20. The computer readable storage medium of claim 18 wherein the computer program further causes the computer to increase the VENC value by increasing an amplitude of a velocity encoding gradient until the VENC value corresponds to a peak flow velocity to thereby identify severity of the stenosis.

21. The computer readable storage medium of claim 18 wherein the computer program further causes the computer to allow user rotation of resultant flow sensitizing gradients in real-time.

* * * * *

UNITED STATES PATENT AND TRADEMARK OFFICE
CERTIFICATE OF CORRECTION

PATENT NO. : 6,317,620 B1
DATED : November 13, 2001
INVENTOR(S) : Ho et al.

It is certified that error appears in the above-identified patent and that said Letters Patent is hereby corrected as shown below:

<u>Column 11,</u>
Line 53, insert -- flow sensitizing -- before the word "gradients".

Signed and Sealed this

Ninth Day of July, 2002

Attest:

Attesting Officer

JAMES E. ROGAN
*Director of the United States Patent and Trademark Office*